United States Patent [19]

Hashimoto

[11] Patent Number: 5,786,114
[45] Date of Patent: Jul. 28, 1998

[54] ATTENUATED PHASE SHIFT MASK WITH HALFTONE BOUNDARY REGIONS

[75] Inventor: Koji Hashimoto, Yokohama, Japan

[73] Assignee: Kabushiki Kaisha Toshiba, Kawasaki, Japan

[21] Appl. No.: 780,840

[22] Filed: Jan. 10, 1997

[51] Int. Cl.$^6$ ..................................................... G03F 9/00
[52] U.S. Cl. ............................................................ 430/5
[58] Field of Search ................................. 430/5, 322, 324

[56] References Cited

U.S. PATENT DOCUMENTS

| | | |
|---|---|---|
| 4,855,197 | 8/1989 | Zapka et al. . |
| 4,957,834 | 9/1990 | Matsuda et al. . |
| 4,985,319 | 1/1991 | Watakabe et al. . |
| 5,234,781 | 8/1993 | Sakamoto et al. . |
| 5,286,581 | 2/1994 | Lee . |
| 5,300,378 | 4/1994 | Minami . |
| 5,302,477 | 4/1994 | Dao et al. . |
| 5,348,826 | 9/1994 | Dao et al. . |
| 5,354,632 | 10/1994 | Dao et al. . |
| 5,384,219 | 1/1995 | Dao et al. . |
| 5,387,485 | 2/1995 | Sukegawa et al. . |
| 5,409,789 | 4/1995 | Ito . |
| 5,418,093 | 5/1995 | Asai et al. . |
| 5,429,896 | 7/1995 | Hasegawa et al. . |
| 5,429,897 | 7/1995 | Yoshioka et al. . |
| 5,446,521 | 8/1995 | Hainsey et al. . |
| 5,472,812 | 12/1995 | Sekine ............................. 430/5 |
| 5,477,058 | 12/1995 | Sato . |
| 5,614,335 | 3/1997 | Hashimoto et al. ............ 430/5 |

FOREIGN PATENT DOCUMENTS 7-104457(A) 4/1995 Japan.

OTHER PUBLICATIONS

M. Nakajima et al., "Attenuated phase-shifting mask with a single-layer absorptive shifter of CrO, CrON, MoSiO and MoSiON film," SPIE, vol. 2197, pp. 111-121, Jan. 1994.

Ito et al., "Optimization of Optical Properties for Single-Layer halftone Masks", SPIE vol. 2197, pp. 99, Jan. 1994.

C. Harper et al., "Electronic Materials & Processes Handbook", 2d ed., 1994, & 10.4, pp. 10.33-10.39.

*Primary Examiner*—S. Rosasco
*Attorney, Agent, or Firm*—Banner & Witcoff, Ltd.

[57] ABSTRACT

In the production of an attenuated phase shift mask, boundary regions, e.g., inter-chip or circuit exposure light isolation frame regions and a kerf region of the mask, are formed from the halftone layer used to form the circuit pattern regions. The boundary regions are shielded from a stabilization treatment of the halftone layer serving to stabilize the transmittance of the circuit pattern regions at an increased optimum level. In this manner, the transmittance of the boundary regions remains relatively low, thereby avoiding the problem of exposure light leaking to adjacent chip areas in a step and repeat or scanning exposure process. The process also assures that reticle alignment marks formed in the frame and/or kerf regions are reliably detectible by the visible light used for mask alignment. The process eliminates the extra steps required to form isolation frames and alignment marks from a separate opaque layer, and avoids the need for data intensive sub-resolution patterning.

11 Claims, 3 Drawing Sheets

ATTENUATED PHASE SHIFT MASK WITH HALFTONE BOUNDARY REGIONS

BACKGROUND OF THE INVENTION

The present invention relates to masks used in the production of semiconductor integrated circuits (IC's). More specifically, the present invention relates to attenuated phase shift mask structures for producing multiple chips or circuits on a wafer using a step and repeat or scanning exposure process, and production methods therefor.

Today, most semiconductor integrated circuits are formed utilizing optical photo-fabrication techniques. This typically involves the controlled projection of ultraviolet (UV) light through a mask (i.e., reticle) and onto a layer of light-sensitive resist material deposited on a semiconductor wafer. The mask typically embodies a light transmissive substrate with a layer of light blocking material defining a pattern of circuit features to be transferred to the resist coated wafer. If a negative-tone resist is used, then the projected exposure light passing through the mask will cause the exposed areas of the resist layer to undergo polymerization and cross-linking resulting in an increased molecular weight. In a subsequent development step, unexposed portions of the resist layer will wash off with the developer, leaving a pattern of resist material constituting a reverse or negative image of the mask pattern. Alternatively, if a positive-tone resist is used, the exposure light passed through the mask will cause the exposed portions of the resist layer to become soluble to the developer, such that the exposed resist layer portions will wash away in the development step, leaving a pattern or resist material corresponding directly to the mask pattern. In both cases, the remaining resist will serve to define a pattern of exposed semiconductor material that will undergo subsequent processing steps (e.g., etching and deposition) for forming the desired semiconductor devices.

Recently, phase-shifting mask techniques have been developed. Phase-shifting masks (PSM's) are distinguished from conventional photolithographic masks by the employment of selectively placed mask pattern materials allowing the transmission of exposure light with a phase-shift of $\pi(180°)$. First pioneered in the early 1980's, such techniques hold great promise for extending the limits of conventional photolithography to the production of circuit features as small as 0.25 µm, and perhaps smaller. The 180° phase difference created at the mask pattern edges set up an interference effect that significantly enhances image contrast at the edges, resulting in higher resolution and greater depth of focus (as compared to the conventional binary intensity masks utilizing only an opaque mask pattern material, e.g., chrome). Advantageously, the technique can be employed utilizing conventional photolithographic stepper optics and resist techniques.

Numerous PSM techniques have been developed. These include alternating, subresolution, rim, and attenuated phase-shifting techniques. See generally, C. Harper et al., *Electronic Materials & Processes Handbook*, 2d ed., 1994, § 10.4, pp. 10.33–10.39. Of these, attenuated phase-shifting techniques are among the most versatile, since they can be applied to any arbitrary mask pattern. In attenuated PSM's, a single slightly transmissive (halftone) absorber providing a phase-shift of 180° can take the place of the conventional opaque, e.g., chrome, layer of mask pattern material. Originally, halftone materials were formed of two layers: a transmittance controlling layer and a phase controlling layer. More recently, advantages have been realized through the use of single layer materials developed to perform the dual function of controlling light transmittance and phase-shift. As reported in Ito et al., *Optimization of Optical Properties for Single-layer Halftone Masks*, SPIE Vol. 2197, p. 99, January 1994 (hereby incorporated by reference in its entirety), one such material comprises SiNx, wherein the composition ratio is controlled by changing the amount of flowing nitrogen.

In the well known exposure processes, e.g., step and repeat and scanning processes, a master mask is made comprising enough individual circuit patterns to cover a full wafer. Each of the circuit patterns corresponds to an individual die on the wafer that ultimately will become a separate chip. The mask and wafer are precisely aligned with each other utilizing alignment marks provided on the mask in the boundary regions adjacent the circuit patterns, e.g., a kerf region, and/or frame regions surrounding the respective circuit patterns. In the case of DRAM, alignment marks are typically provided in the kerf as well as in a boundary region between a test site region and primary region comprising memory cell and peripheral circuits. An alignment light source of the stepper or scanner is provided for detecting the marks. In a stepping process, the mask and wafer are secured on a stage which is moved, i.e., stepped, relative to the exposure light source so that the entire wafer is exposed, chip-by-chip. An exemplary and well known step and repeat exposure apparatus is the Nikon Step and Repeat stepper. In a scanning process, an exposure light source is scanned across the aligned mask and wafer to expose the respective circuit regions. A well known scanning exposure device is the SVGL Micrascan scanner.

In order to prevent inadvertent multiple or excessive exposures of adjacent chip areas during the exposure process, it is conventional to form frames of opaque light blocking material around each of the individual circuit patterns of the mask. This serves to shadow the exposure light so that it exposes only a single chip area, without leaky light affecting adjacent chip areas. The opaque material can also be used to form high contrast reticle alignment marks (holes or islands), e.g., in the frame and/or kerf regions.

In the fabrication of a conventional binary intensity mask, the opaque frames can be formed together as part of a composite circuit pattern comprising the individual chip patterns. The reticle alignment marks can also be formed in the same step. However, in the case of attenuated PSM's, since the circuit patterns are formed from halftone material adjusted to an optimum (relatively high) transmittance of the exposure light, it is necessary to utilize additional steps to form opaque frames and/or opaque reticle alignment marks. Alternatively, if the frame and reticle alignment marks are formed from the stabilized halftone material used to form the circuit pattern, problems can arise with (1) leakage of light through the halftone frames separating the individual patterns, and (2) detection of the halftone reticle alignment marks. As explained in commonly assigned U.S. Pat. No. 5,477,058 to Sato (hereby incorporated by reference in its entirety), reticle alignment marks formed of halftone material optimized relative to the UV exposure light may appear transparent to the visible light used to detect the marks, thus giving rise to difficulties in achieving accurate and reliable mask/wafer alignment.

FIGS. 1A–1E show sequential stages of a conventional attenuated PSM fabrication process. Initially, as shown on FIG. 1A, a chromium layer 1 is deposited on a quartz substrate 3 to form a chromium blank 4. Following an oxidation removal treatment to increase the adhesion of the halftone film, e.g., SiNx, to the Cr layer, the opaque Cr layer is patterned with inter-chip frames 5 and kerf 7 (see FIG.

1B). The patterning requires application of a resist layer, exposure (e.g., by laser or electron beam) of the resist layer, resist development, etching of the exposed areas, and resist removal. Following this first patterning stage, steps are taken to inspect the mask and repair defects.

Next, a halftone layer 9 is deposited over the patterned chrome layer, and a stabilization process is performed thereon (see FIG. 1C). The stabilization process involves a controlled oxidation of the halftone material, e.g., SiNx, to increase transmittance to (and stabilize transmittance at) an optimum level (typically between 2-10%). The halftone layer is then patterned with the individual circuit patterns and alignment marks 12 (see FIG. D.). Like the frame patterning, this conventional process requires application of a resist layer, exposure of the resist layer, resist development, etching (e.g., by electron beam or laser), and resist removal. At this stage, the mask must once again be inspected and any defects are repaired.

The chromium layer 1 must then be subjected to a second patterning process to complete the reticle alignment marks 12 in the kerf and/or frame regions of the mask (see FIG. E). This is followed by a third inspection and repair process.

The formation of opaque frames and reticle alignment marks in the above process obviously significantly increases mask turn around time (TAT) and fabrication expense. To avoid the requirement of an opaque layer for forming opaque frames, and the problem of leaky light associated with frames formed from the halftone layer used to form the circuit patterns, it has been proposed to isolate the exposure light to individual circuit patterns with circuit surrounding sub-resolution "blind" patterns in the halftone layer. See, e.g., M. Nakajima et al., *Attenuated phase-shifting mask with a single-layer absorptive shifter of CrO, CrON, MoSiO and MoSiON film*, SPIE Vol. 2197/111-121 (0-8194-1492-1/94); and U.S. Pat. Nos. 5,446,521 (Hainsey et al.); 5,429,896 (Hasegawa et al.); and 5,429,897 (Yoshioka et al.).

With such sub-resolution patterning techniques, exposure light beams passing through the pattern are caused to interfere with each other, significantly decreasing the effective transmittance. (As reported by Nakajima et al., the ratio of transparent region to shifter (halftone) region within the pattern corresponds to the square root of the transmittance (T).) However, since the size of the pattern elements must be below the resolution of the stepper, the data volume for generation of the blind patterns is very large. To translate the design data to inspection data or writing data (e.g., electron beam patterning data) requires a large amount of computational power and time, as well as a large data storage capacity. Moreover, while the sub-resolution patterning of an SiNx halftone layer decreases transmittance of deep UV exposure light having a relatively low wavelength (e.g. 248 nm) to a target level of about 6%, it may not decrease transmittance of the alignment light (wavelength in range of 400-700 nm) enough to make alignment marks formed in this manner readily detectible. As a result, difficulties in achieving accurate and reliable mask/wafer alignment may arise, or extra steps must be taken to separately form readily detectible mask alignment marks.

SUMMARY OF THE INVENTION

In view of the foregoing, it is a principal object of the present invention to provide a straightforward and relatively simple process for forming, in an attenuated PSM, effective exposure light isolation boundaries, e.g., frames, whereby defects due to inadvertent exposure of adjacent circuit regions are avoided, and mask TAT and fabrication expense are reduced.

It is a further object of the invention to provide an exposure light isolation region forming technique that allows for simultaneous formation of reliably detectible reticle alignment marks.

These and other objects are achieved in accordance with a first aspect of the present invention by a method of making an attenuated phase shifting mask. A halftone layer is deposited on a light transmissive substrate. The halftone layer is patterned to comprise circuit pattern regions and boundary regions adjacent the circuit pattern regions (e.g., frame regions surrounding respective circuit pattern regions and/or a kerf region of the mask). A selective stabilization treatment is performed on the circuit pattern regions to optimize the transmittance of the halftone layer therein for an exposure light wavelength. At the same time, the halftone layer is maintained in its original state in the boundary regions, so that the transmittance of the circuit pattern regions is increased relative to the transmittance of the boundary regions.

In a second aspect, the invention is embodied in an attenuated phase shift mask. A light transmissive substrate has a patterned layer of halftone material thereon. The patterned layer of halftone material comprises a plurality of circuit pattern regions having a light transmissivity $T_1$ and a corresponding plurality of boundary regions adjacent the circuit pattern regions and having a light transmissivity $T_2$ less than $T_1$. The boundary regions are free of sub-resolution patterning.

These and other objects, features and advantages of the present invention will be readily apparent and fully understood from the following detailed description of the preferred embodiments, taken in connection with the appended drawings.

DETAILED DESCRIPTION OF THE PREFERRED EMBODIMENTS

Figure 1A:
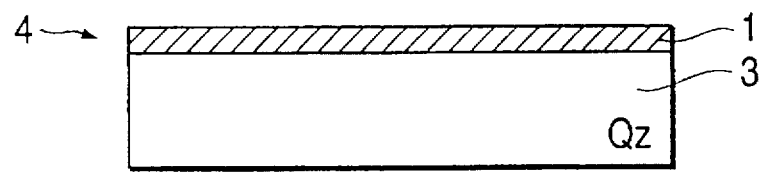
FIG 1A-1E are diagrammatic cross-sectional views illustrating sequential stages of production of an attenuated phase shift mask in accordance with a conventional technique.
Figure 1B:
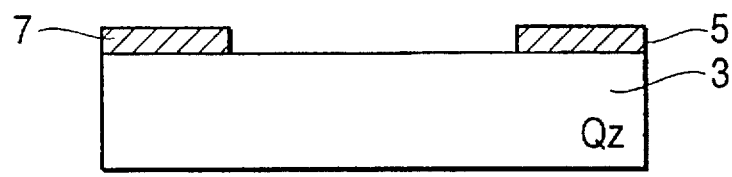
Figure 1C:
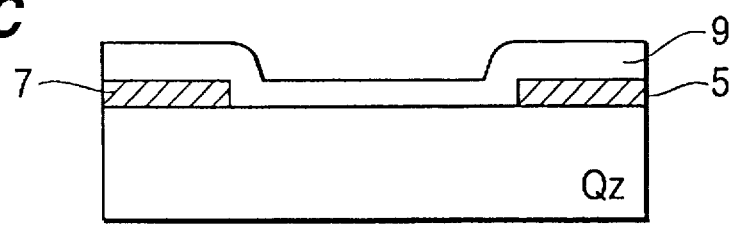
Figure 1D:
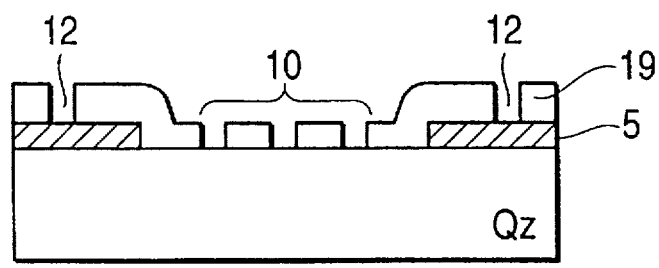
Figure 1E:
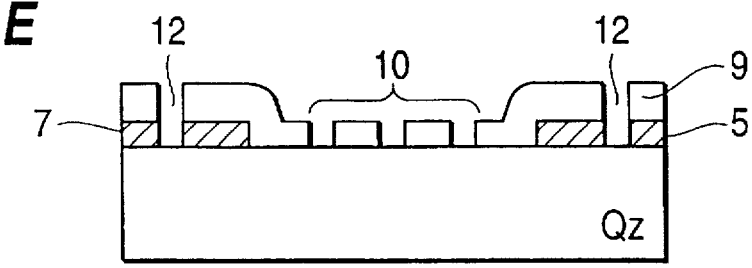
Figure 2A:
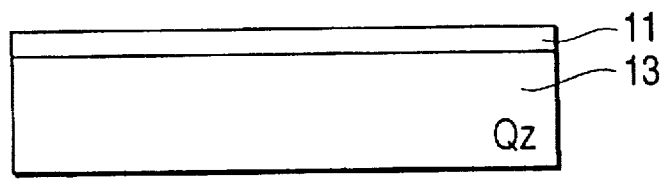
FIGS. 2A-2C are diagrammatic cross-sectional views illustrating sequential stages of production of an attenuated phase shift mask in accordance with the present invention.
Figure 2B:
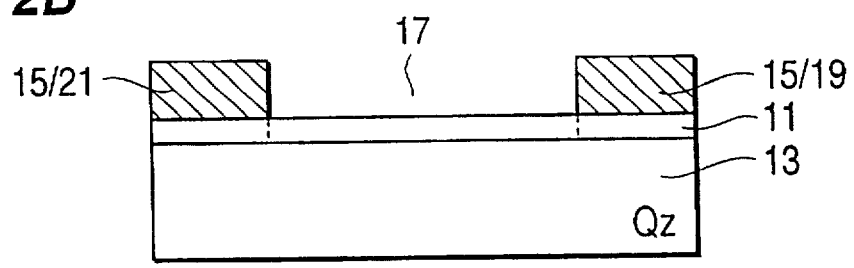
Figure 2C:
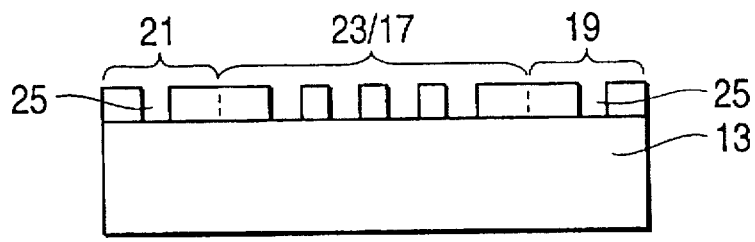

Referring to FIGS. 2A-2C, a first process for manufacturing an attenuated PSM in accordance with the present invention is described. First, a halftone layer 11 is deposited on a suitable light transmissive substrate 13, e.g., quartz (see FIG. 2A). Suitable halftone films comprise, e.g., SiNx, SiO, SiON, SiN, CrO, CrN, CrON, AlO, AlON, AlN, MoSiO, MoSiN, MoSiNO, TiO, TiN, TiON compositions providing both phase shifting and light attenuation. Prior to stabilization, such a layer may provide a 3% transmissivity and 160° phase shift of UV exposure light. As used herein, the term "halftone layer" encompasses known layers whose sole function is light attenuation, as well as layers, such as SiNx, performing the dual functions of light attenuation and phase shifting.

Next, halftone layer 11 is patterned with a resist layer 15 into circuit pattern regions 17, and boundary regions comprising frame regions 19 (only one side visible) surrounding circuit pattern regions 17, and a kerf region 21 (only one side visible). The resist 15 is applied to cover frame regions 19 and kerf region 21, and to leave exposed circuit pattern regions 17. See FIG. 2B.

Next, halftone layer 11 is subjected to a stabilization treatment in the exposed circuit pattern regions. As explained in the Background section, the stabilization treatment serves to partially oxidize the halftone layer and thereby stabilize the transmittance of the film at an ideal increased level for the wavelength and intensity of the exposure light of the stepper or scanner. The process also adjusts and stabilities the phase shift to/at approximately 180°. Resist layer 15 shields the frame and kerf regions 19, 21 from the treatment and thereby maintains the halftone layer in these regions at its original transmissivity. As a result, frame regions 19 will be sufficiently opaque to ensure (1) isolation of the exposure light to the respective chip or circuit regions of the wafer, and (2) reliable detection of any reticle alignment marks formed therein. Also, kerf region 21 of the mask will have the necessary contrast to allow reliable detection of any reticle alignment marks formed therein.

As one example of the stabilization treatment, a halftone layer of SiNx may be subjected to partial oxidation in order to increase its light transmissivity from an original level $T_1=3\%$ to level $T_2=6\%$ suitable for an exposure light of 248 nm provided by a KrF eximer laser stepper.

Suitable stabilization treatments are described in Japanese Published Patent Document No. 7-104457(A), hereby incorporated by reference in its entirety. In accordance with that disclosure, stabilization of a semi-transparent (halftone) layer is achieved by at least one of light emission, heat treatment and oxidation treatment on the semi-transparent layer so that the phase difference and the transmittance of the halftone layer do not change due to light exposure or the passage of time. A stabilized layer or improved property region is formed in the interface between the transparent substrate and the semi-transparent layer, or at least on the surface of the semi-transparent layer, for preventing a change in the physical properties of the semi-transparent layer due to exposure to light or the passage to time.

More specifically, a dangling bond is produced in the semi-transparent layer when the layer is reduced by an oxidation reaction and a cross-linking reaction. Silicon compounds, chromium compounds, aluminum compounds, titanium compounds, molybdenum-silicon compounds or a mixture of these compounds may be used in the semi-transparent layer. In the silicon compounds, a silicon dangling bond with a density of approximately $1.0\times10^{13}/cm^3$ or less is especially desirable. Even semi-transparent layers formed from compounds containing the other elements must be held together with a similar number of dangling bonds.

In accordance with JP 7-104457(A) the stabilized layer or improved-property region may be formed by (1) transmitting light of a wavelength at least partially within the absorption region for the exposure wavelengths of the semi-transparent layer, e.g., infrared light at least partially within the absorption region for the infrared region of the semi-transparent layer; (2) using heat; (3) using oxidation; (4) conducting light treatment and/or heat treatment at the same time as an oxidation treatment, accelerating the process using a property-improving reaction; (5) conducting light treatment and heat treatment at the same time, accelerating the process using a property-improving reaction; or (6) light emissions in the direction of the semi-transparent layer through the transparent substrate, particularly light emission conducted with light in at least part of the absorption region of the physical properties composing the semi-transparent layer.

The improved-property region may be formed by light emission carried out with light of a wavelength $\lambda$ where $k1>k$ ($\lambda$), and where k is the extinction coefficient of the semi-transparent layer, k1 is the extinction coefficient of the semitransparent layer at the exposure wavelength, and $\lambda$ is the wavelength.

In consideration of the change in the refractive index at the time of the qualitative improvement, the refractive index of the semi-transparent layer at the time of layer formation should be set up to differ from the refractive index that satisfies the desired transmittance and phase difference of the semi-transparent layer. The refractive index is then adjusted to a value satisfying the desired transmittance and phase difference by conducting at least one of light emission, heat treatment or oxidation treatment. The refractive index shift may be calculated by conducting at least one of the light emission, heat treatment and oxidation treatment.

In accordance with JP 7-104457(A), a method for producing an exposure mask includes the following steps. A semi-transparent layer is formed on a transparent substrate. A photosensitive resin layer is formed on the semi-transparent layer. The photosensitive resin layer is exposed to light or a charged particle beam to form a photosensitive resin pattern. The photosensitive resin layer is removed from the portions of the semi-transparent layer to be exposed according to the pattern of the mask. After the exposure, the remaining portions of the photosensitive resin layer are then removed. The production method forms a stabilized layer in the boundary region between the transparent substrate and the semi-transparent layer, before or after the photosensitive resin pattern is formed, by exposing the semi-transparent layer, through the transparent substrate, to light with a wavelength contained within the absorption region for exposure wavelengths of the semi-transparent layer and to infrared light contained within the absorption region for the infrared region of the semi-transparent layer. The production method may also improve the boundary region between the transparent substrate and the semi-transparent layer or at least part of the semitransparent layer by conducting at least one of light exposure, heat treatment and oxidation treatment before or after the photosensitive resin pattern is formed.

When light is used in the formation of the stabilized layer or the improved-property region, it should contain at least part of the absorption region for the exposure wavelengths of the semi-transparent layer. When infrared light is used in the formation of the stabilized layer or the improved-property region, it should contain at least part of the absorption region for the infrared range of the semi-transparent layer.

If the stabilized layer or improved-property region is formed using heat, the heat treatment may be conducted on a hot plate or in a high-temperature chamber.

If the stabilized layer or improved-property region is formed using oxidation, the oxidation may be conducted in an atmosphere of oxygen molecules. The oxidation may be conducted through immersion in an oxidizing solution. For the oxidizing solution, a mixture of water and fuming sulfuric acid or fuming nitric acid may be used.

Ideally, a monitoring of the light transmittance, light reflectance, refractive index, change in layer thickness or phase difference will be used to control at least one of the light, heat or oxidation treatments. Ideally, the control of at least one of the light, heat or oxidation treatments will detect the transmittance and phase difference from the refractive index and the layer thickness, and the control will be based on these values.

The formation of the stabilizing layer or the improved-property region may be carried out before the photosensitive resin layer has been formed on the semi-transparent layer, or after the photosensitive resin layer has been formed and the pattern has been formed by exposure to light. The formation of the stabilizing layer or the improved-property region may be carried out by placing the transparent substrate in an atmosphere chamber containing oxygen and forming an oxidized layer on the surface of the semi-transparent layer while simultaneously forming the stabilized layer by exposure to light.

When manufacturing a single or multiple layer semi-transparent phase-shift exposure mask, silicon, chromium, germanium, titanium, tantalum, aluminum, tin, molybdenum silicon, tungsten silicone, other metals, carbides, oxides, hydrides, nitrides and halides of the listed metals, and mixtures of any of these can be used. The composition of these layers is intermediary in order to possess the function of simultaneously controlling both the transmittance and phase difference of the layer, as mentioned above. For this reason, the state of the molecular bonds in the layer is unstable. The electrons contributing to the bonds in these layers are excited by the irradiation energy at the time of exposure, and the state of the bonds is changed as a result from the time the layers are formed. The amplitude transmittance changes compared to the optical constants of the layer, especially the exposure wavelength.

In the process according to JP 7-104457(A), heat treatment is included in order to activate the reaction during oxidation treatment or irradiation. Also, given the change in the refractive indices of the compound elements produced by the light, heat and/or oxidation treatments, the refractive indices of the compound elements and extinction coefficients for the semi-transparent layer are preset when the layer is formed and are controllable so as to be able to produce the maximum possible phase shift effect after the stabilized region has been formed. In this case, it should ideally be preset in the direction along the refractive-index/extinction-coefficient curve obtained when the direction adjustment changes the composition ratio.

A mercury-vapor lamp may be used as the light source for the irradiation, but another light source such as a xenon lamp with a cut-off filter may also be used. An SiN layer may be used as the semi-transparent layer, but other materials as previously indicated may also be used. Another light source, such as an I-ray mercury-vapor lamp, g-ray mercury-vapor lamp or an ArF laser may be used if more appropriate for the particular semi-transparent layer composition.

A mixed oxidized solution of hydrogen peroxide and sulfuric acid may be used for surface oxidation, but a stronger oxidizing agent such as fuming sulfuric acid may also be used. An oxidizing atmosphere such as ozone gas may also be used. The CVD method may also be used to form an oxidized surface. In addition, layer formation and improved-property reaction criteria can be adjusted so as to create a gradient in the oxygen content in the stabilized region. In addition, the thickness of the semi-transparent layer can be changed. Moreover, a charge-up prevention layer may be formed in advance on the substrate, instead of forming a conductive layer on top of the semi-transparent layer.

Following the stabilization treatment, the patterned resist layer 15 is removed and a conventional process is carried out to create in the halftone layer circuit patterns 23 (in circuit pattern regions 17) and reticle alignment marks 25 located in one or both of the frame and kerf regions (see FIG. 2C). The patterning process typically will involve application of a resist layer over the entire halftone layer, patterning of the resist layer by electron beam or laser patterning, resist development, and finally etching of the exposed halftone layer regions. After the resist is removed, the mask is inspected, and repaired as necessary.

It will be appreciated that the above process is considerably simplified in comparison to the conventional process involving separate formation of opaque exposure light isolation frames and reticle alignment marks, and the number of process steps is considerably reduced. For example, with this process flow, the steps associated with depositing and patterning a separate opaque layer are completely eliminated, and just one inspection and repair stage is necessary (instead of three). Moreover, unlike the known techniques for forming exposure isolation frames by sub-resolution patterning of the halftone layer, the present invention does not require an additional level of data intensive patterning.

Figure 3:
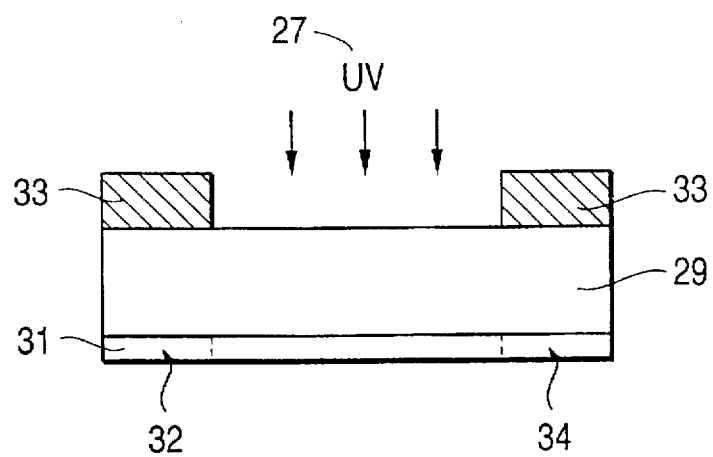
FIG. 3 is a diagrammatic cross-sectional view illustrating the production of an attenuated phase shift mask in accordance with a second embodiment of the present invention.

A second embodiment of the present invention is now described with reference to FIG. 3. In this case, deep UV exposure light (e.g., 248 nm) of the stepping or scanning apparatus is initially used for halftone film stabilization. The wafer is turned over in the stepper or scanner and UV light 27 is projected through the substrate 29 and onto the backside of the halftone, e.g., SiNx, layer 31. The energy from the exposure causes the Si to combine with air to form a stabilized composition including increased levels of $SiO_2$. The frame and kerf regions 32, 34 of the mask are shadowed by an opaque reticle blind 33 deposited or positioned on the backside of substrate 29. By placing the blind on the backside of the substrate, potential damage to the mask patterns is avoided.

The second embodiment utilizing a reticle blind avoids the initial resist application and patterning steps of the first embodiment. It is most applicable for cases in which the "blinded" areas are relatively large and simple in shape. Where it is necessary to cover regions of very small size and/or complex shape, e.g., complex reticle alignment marks, the first embodiment is generally preferable.

Figure 4:
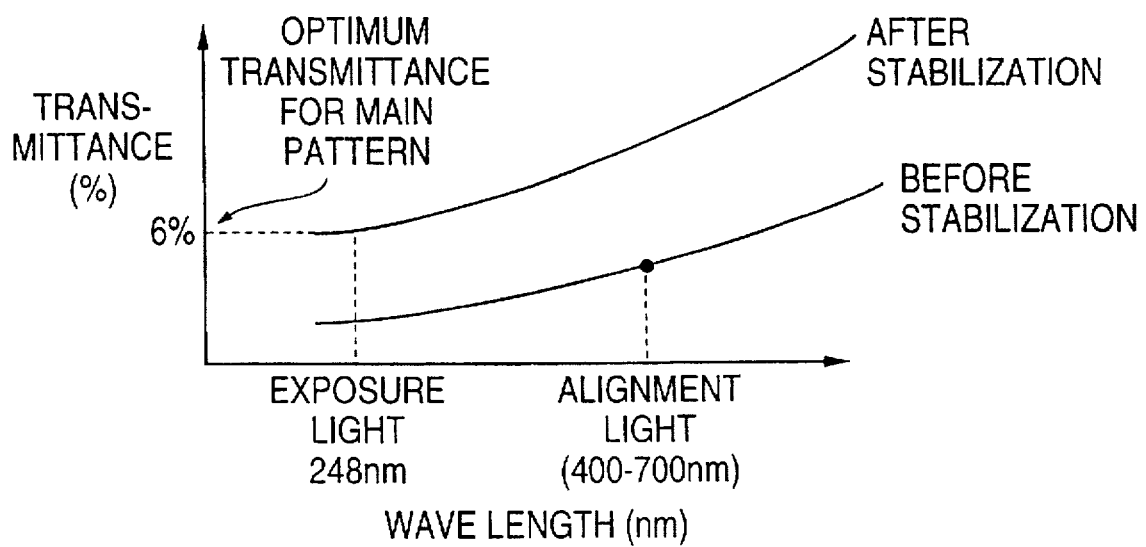
FIG. 4 is a graph illustrating how the light transmittance of a halftone material varies as a function of the wavelength of the incident light (before and after stabilization).

FIG. 4 shows how transmittance of the halftone film varies as a function of the wavelength of the incident light. The affect of the stabilization process on light transmittance is also apparent. It can be seen that transmittance increases as a function of light wavelength (the particular function depends on the halftone material used), and that the stabilization treatment has the effect of generally increasing transmittance for all wavelengths. At the exposure light wavelength of 248 nm, the transmittance of the circuit pattern is increased to the optimum level of 6%. Since the halftone layer is not subjected to the stabilization process in the frame and kerf regions, the transmittance in these regions remains relatively low, even for the relatively long wavelength of the alignment light (400–700 nm). As a result, reliable detection of the alignment marks is assured, and inter-chip or circuit exposure light leakage can be avoided.

The present invention has been described in terms of preferred embodiments thereof. Other embodiments, variations and modifications within the scope and spirit of the appended claims will occur to persons of ordinary skill in the art upon reviewing this disclosure.

I claim:

1. A method of making an attenuated phase shift mask, comprising:

depositing a halftone layer on a light transmissive substrate;

patterning the halftone layer to comprise circuit pattern regions and boundary regions adjacent said circuit pattern regions; and performing a selective stabilization treatment on said circuit pattern regions to optimize the transmittance of the halftone layer therein for an exposure light wavelength, while maintaining the halftone layer in its original state in the boundary regions, so that the transmittance of the circuit pattern regions is increased relative to the transmittance of the boundary regions;

wherein said boundary regions comprise frame regions surrounding respective said circuit pattern regions, and at least one of said frame regions forms an alignment mark.

2. A method according to claim 1, wherein said maintaining is achieved by shielding said boundary regions from a stabilization agent applied to the circuit pattern regions.

3. A method according to claim 2, wherein said stabilization agent comprises an oxidizing agent and the boundary regions are shielded from the oxidizing agent by a patterned resist layer.

4. A method according to claim 2, wherein said stabilization agent comprises electromagnetic radiation and the boundary regions are shielded from the electromagnetic radiation by a reticle blind.

5. A method according to claim 4, wherein said electromagnetic radiation comprises UV light.

6. A method according to claim 4, wherein said electromagnetic radiation is projected through said substrate and onto a backside of said halftone layer.

7. A method according to claim 1, wherein said boundary regions comprise a kerf region of the mask.

8. A method according to claim 7, wherein said kerf region forms a reticle alignment mark.

9. An attenuated phase shift mask comprising a light transmissive substrate and a patterned layer of halftone material thereon, said patterned layer of halftone material comprising a plurality of circuit pattern regions having a light transmissivity $T_1$ and a corresponding plurality of boundary regions adjacent said circuit pattern regions and having a light transmissivity $T_2$ less than $T_1$, said boundary regions being free of sub-resolution patterning and comprising frame regions surrounding respective said circuit pattern regions, at least one of said frame regions forming an alignment mark.

10. An attenuated phase shift mask according to claim 9, wherein the boundary regions comprise a kerf region of the mask.

11. An attenuated phase shift mask according to claim 10, wherein said kerf region forms a reticle alignment mark.

* * * * *